US010544499B1

(12) United States Patent
Singh et al.

(10) Patent No.: US 10,544,499 B1
(45) Date of Patent: Jan. 28, 2020

(54) REFLECTOR FOR VEHICLE LIGHTING

(71) Applicant: VALEO NORTH AMERICA, INC., Troy, MI (US)

(72) Inventors: Shivi Singh, Columbus, IN (US); Scott Adaska, Seymour, IN (US); Robert Fraizer, Seymour, IN (US); Thomas Nolan, Seymour, IN (US)

(73) Assignee: VALEO NORTH AMERICA, INC., Troy, MI (US)

( * ) Notice: Subject to any disclaimer, the term of this patent is extended or adjusted under 35 U.S.C. 154(b) by 0 days.

(21) Appl. No.: 16/102,329

(22) Filed: Aug. 13, 2018

(51) Int. Cl.
  *C23C 14/00* (2006.01)
  *C22C 9/00* (2006.01)
  *F21V 7/22* (2018.01)
  *F21S 43/50* (2018.01)
  *F21S 41/37* (2018.01)

(52) U.S. Cl.
  CPC ............ *C23C 14/0015* (2013.01); *C22C 9/00* (2013.01); *F21S 41/37* (2018.01); *F21S 43/50* (2018.01); *F21V 7/22* (2013.01)

(58) Field of Classification Search
  CPC ..... C23C 14/0015; C23C 14/00; C23C 14/24; C23C 14/35; C23C 14/3457; F21S 41/37; F21S 43/50; C22C 9/00; F21V 7/22; H01J 37/3405; H01J 37/3408; G11B 5/851; B11B 7/266; H01L 21/203; C03C 2218/156; B41J 2/1646; B01D 67/0072; B01J 37/34; B81C 2201/0181
  See application file for complete search history.

(56) References Cited

U.S. PATENT DOCUMENTS

| | | | | |
|---|---|---|---|---|
| 4,482,209 A * | 11/1984 | Grewal | ............... | G02B 5/0858 359/883 |
| 4,490,228 A * | 12/1984 | Bodin | .................. | C23C 14/024 204/192.14 |
| 5,527,562 A * | 6/1996 | Balaba | ................ | C09D 183/04 427/162 |
| 5,828,493 A * | 10/1998 | Bischer, Jr. | ........... | C23C 14/022 359/584 |
| 5,865,530 A | 2/1999 | Weber | | |
| 6,392,350 B1 * | 5/2002 | Amano | ................ | C23C 16/401 204/298.16 |
| 6,520,650 B2 | 2/2003 | Fraizer | | |
| 6,627,307 B1 * | 9/2003 | Reichert | .............. | G02B 5/0866 428/332 |
| 7,742,225 B2 * | 6/2010 | Wu | .......................... | F21V 7/22 359/359 |
| 7,830,075 B2 * | 11/2010 | Wu | .......................... | F21V 7/22 313/111 |
| 2003/0203107 A1 * | 10/2003 | Cote | .................... | B05D 3/0218 427/233 |
| 2004/0085772 A1 * | 5/2004 | Daichou | ............ | B29C 45/0005 362/341 |
| 2006/0067623 A1 | 3/2006 | Viard et al. | | |

(Continued)

*Primary Examiner* — Joseph L Williams
*Assistant Examiner* — Jose M Diaz
(74) *Attorney, Agent, or Firm* — Oblon, McClelland, Maier & Neustadt, L.L.P.

(57) ABSTRACT

A method of treating a part, includes placing a bulk molded compound (BMC) part into a vacuum chamber of a magnetron sputtering apparatus and igniting a plasma in the vacuum chamber. A filler layer is deposited onto the surface of the BMC part, and a metal layer is sputter deposited onto the filler layer to create a reflective surface of the BMC part.

18 Claims, 3 Drawing Sheets

(56) References Cited

U.S. PATENT DOCUMENTS

| | | | | |
|---|---|---|---|---|
| 2006/0139744 | A1* | 6/2006 | Mehrtens | F21V 7/22 359/360 |
| 2006/0240281 | A1* | 10/2006 | Liao | H01L 51/5206 428/690 |
| 2008/0122012 | A1* | 5/2008 | Fukuhara | H01L 21/28273 257/397 |
| 2008/0289957 | A1* | 11/2008 | Takigawa | C23C 14/205 204/298.11 |
| 2009/0207879 | A1* | 8/2009 | Kurashina | G01J 5/02 374/133 |

* cited by examiner

REFLECTOR FOR VEHICLE LIGHTING

BACKGROUND

Technical Field

The invention relates to molded plastic parts used for vehicle lamp reflectors.

Background Art

Bulk molding compound (BMC) is a widely used material to make modern automotive light devices. BMC is a combination of resin, glass fiber, and filler materials mixed into a compound that can be injection molded into complex parabolic shaped parts that are coated with metal to form parabolic reflectors for the light device. Although the glass fibers and fillers improve strength reduce overall cost of the BMC based reflectors, these materials can cause the BMC molded part to have a rough irregular surface. Direct metallizing of such surface generally results in a poor quality reflector that cannot provide the optical properties necessary for many vehicle lighting functions. In particular, the directly applied metallization layer has the same surface irregulates as the BMC part, and hazing often occurs on the metal possibly due to outgassing from the BMC resin.

To address these problems, an acrylic base coat is applied to the surface of the BMC part where the reflector is to be formed. This base coat evens the rough surface of the BMC part to provide the smooth base needed for a reflector, and prevents hazing that occurs on direct metallized BMC parts. However, the base coat must be applied by a complex spray coating and curing process that requires large capital and floor space investment. Thus, there have been efforts to provide a BMC reflector that meets optical requirements for vehicle lighting without the use of a base coating. For example, U.S. Pat. No. 5,865,530 discloses a BMC formulation and molding process that improves surface smoothness such that metallization may be directly applied to the BMC part. Nevertheless, the resulting reflectors do not provide photometric properties suitable for many vehicle lighting applications, and often have hazing which is aesthetically undesirable for clear lens vehicle light devices. Thus, the processes disclosed in U.S. Pat. No. 5,865,530 have not been widely adopted by the vehicle lighting industry, and base coating is generally accepted as a necessary process for producing high quality vehicle light reflectors.

The "background" description provided herein is for the purpose of generally presenting the context of the disclosure. Work of the presently named inventors, to the extent it is described in this background section, as well as aspects of the description which may not otherwise qualify as conventional art at the time of filing, are neither expressly nor impliedly admitted as conventional art against the present disclosure.

SUMMARY

Embodiments described herein include the following aspects in accordance with the following claims:

(1) A method of treating a part, including placing a bulk molded compound (BMC) part into a vacuum chamber of a magnetron sputtering apparatus; igniting a plasma in the vacuum chamber; depositing a filler layer to the surface of the BMC part; and sputter depositing a metal layer onto the filler layer to create a reflective surface of the BMC part.

(2) The method of claim 1, wherein the BMC part includes crushed/super fine glass dispersed in a BMC compound.

(3) The method of claim 2, wherein the crushed glass has a particle size of 300-600 nm.

(4) The method of claim 1, wherein the BMC part has a surface roughness of 200 microns or less.

(5) The method of claim 4, wherein the BMC part has a surface roughness of 120 to 150 microns.

(6) The method of claim 1, wherein the depositing a filler layer includes depositing a layer including at least one of copper, SiO2, and SiOx, where x is a number other than 2 which represents the amount of oxygen.

(7) The method of claim 6, wherein said depositing a filler layer comprising:

depositing a second layer of sputtered copper on the first layer or vice versa.

(8) The method of claim 1, further including cleaning the BMC part prior to forming the filler layer.

(9) The method of claim 8, wherein the cleaning includes exposing a surface of the BMC part to a glow discharge process.

(10) The method of claim 1, wherein the metal layer consists of aluminum.

(11) The method of claim 1, further including applying a protective layer onto the part after depositing a coating onto the part.

(12) The method of claim 11, wherein the protective layer includes one of hexymethyldisiloxane (HMDSO) or tetramethyldisiloxane (TMDSO).

(13) A vehicle lighting device including a base molding compound (BMC) part; a vacuum chamber deposited filler layer provided directly on the BMC part; and a metal layer provided directly on the filler layer.

(14) The device of claim 13, wherein the filler layer includes at least one of copper, SiO2, and SiOx, where x is a number other than 2 which represents the amount of oxygen.

(15) The device of claim 13, wherein the metal layer includes aluminum.

(16) The device of claim 17, wherein the metal layer consists of aluminum.

(17) The device of claim 18, further including a protective layer formed directly on the metal layer.

(18) The device of claim 11, wherein the protective layer includes one of hexymethyldisiloxane (HMDSO) or tetramethyldisiloxane (TMDSO).

The foregoing paragraphs have been provided by way of general introduction, and are not intended to limit the scope of the following claims. The described embodiments, together with further advantages, will be best understood by reference to the following detailed description taken in conjunction with the accompanying drawings.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION

Embodiments described herein provide systems of and methods for reactive sputtered coatings. In particular, metal nitride coatings are applied to plastic automotive parts to provide a metallic appearance capable of surviving a harsh automotive lamp environment.

The following descriptions are meant to further clarify the present disclosure by giving specific examples and embodiments of the disclosure. These embodiments are meant to be illustrative rather than exhaustive. The full scope of the disclosure is not limited to any particular embodiment disclosed in the specification, but rather is defined by the claims.

In the interest of clarity, not all of the features of the implementations described herein are shown and described in detail. It will be appreciated that in the development of any such actual implementation, numerous implementation-specific decisions will be made in order to achieve the developer's specific goals, such as compliance with application- and business-related constraints, and that these specific goals will vary from one implementation to another and from one developer to another.

As noted in the Background section above, base coating is generally accepted as a necessary process for producing high quality BMC vehicle light reflectors. However, the present inventors have recognized that even base coated BMC reflectors often cannot meet the optical requirements of modern vehicle light devices. In researching this problem, the present inventors discovered that base coat layers typically have a thickness on the order of micrometers, which creates an irregular surface profiles due to pooling of the coating material on part edges. This irregular profile results in deviation from the intended optical performance of the light device, particularly where LED light sources are used as these devices are highly sensitive to the irregular profile.

Figure 1:
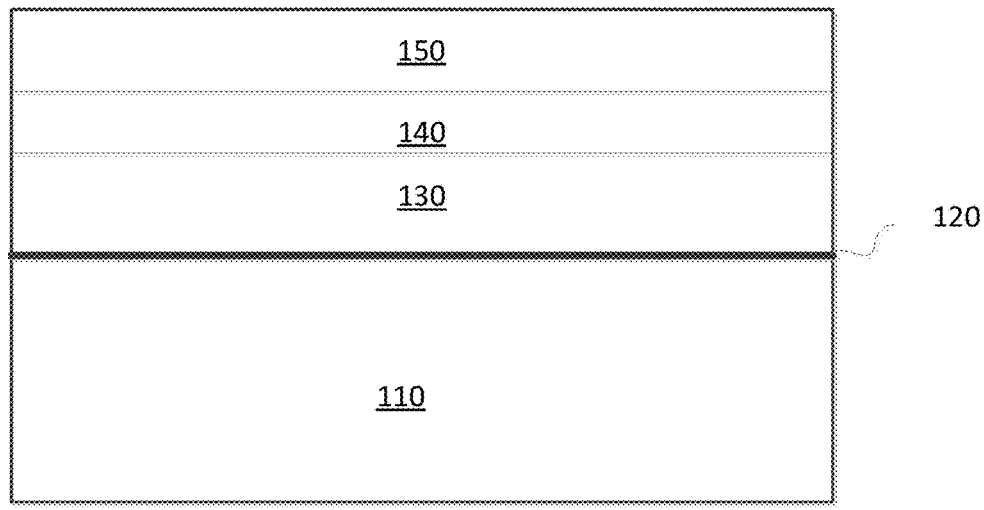
FIG. 1 illustrates an exemplary sputter coated part according to one embodiment.

FIG. 1 illustrates cross section view of an example vehicle lighting part according to embodiments described herein. The part 100 includes a substrate coated as a decorative and/or functional layer, which can be used as a reflector, a bezel, or a trim piece in the automotive industry and in particular, as a lamp reflector, a lamp bezel, or a lamp trim piece in the automotive industry.

Substrate 110 is made from BMC material and has a cleaned surface 120. A typical thermoset molding compound used in headlamp manufacture contains an unsaturated polyester resin, styrene, a low profile additive, mineral fillers, and glass reinforcements. Such BMC bulk molding materials are known in the art, and numerous variations to the particular composition are possible. However, the present inventors discovered that a BMC formulation with crushed glass dispersed therein can improve surface roughness of the molded part. For example, conventional molded BMC parts have a typical surface roughness of 200 microns. Dispersing crushed glass with a particle size of 300-600 nm, or 30 to 50 mesh size, in the BMC compound provides a surface roughness of about 120 to 150 microns. This BMC formula generally includes the following:

Filler—$CaCO_3$;
Glass Fiber—$SiO_2$;
Polyester Resin—such as Orthophalic or Isophthalic or Vinyl esters or Phenolics;
Low Profile Resin—PMMA (Polymethyl methacrylate);
Styrene—Styrene or Vinyltoluene or DAP;
Catalysts/Inhibitors—Ketone or Cobalt or Peroxyester; and
Mold Release—ZnSt or CaSt (zinc stearate, calcium stearate).

Cleaning is performed on the BMC molded part by exposing the surface of the substrate 110 to a glow discharge as discussed further below.

A filler layer 130 is provided on the cleaned surface 120. The filler layer 130 is a conformal layer that provides a macro smoothing of the BMC surface suitable for direct application of reflective material. The filler layer 130 may be made from $SiO_2$ or non-stoichiometric $SiO_x$, where x is a number other than 2 which represents the amount of oxygen content. The filler layer 130 may also be a combination of $SiO_2$ and $SiO_x$. Alternatively, the filler layer 130 may be a copper layer alone, or provided in addition to the $SiO_2$ and $SiO_x$ layer. The filler layer 130 has a maximum thickness of 1 micron. In one embodiment, the filler layer is approximately 20-100 nm thick.

Metallization layer 140 is provided directly on the filler layer 130 to give the part reflective properties. The metal may be aluminum, for example, but any metal suitable for providing a reflective surface may be used. A transparent protective layer 150 (such as HMDSO) is provided on the metal layer 140 to protect the metal coating 140. In one embodiment, the protective coating is Plasil™. However, other materials that provide a clear protective coating to the metal 140 and provide protection from a harsh automotive lamp environment can be used for protective coating 150. The metal layer of Aluminum ranges from 60 nm to 150 nm and HMDSO protective layer ranges from 40 nm to 200 nm.

The part 100 provides a BMC reflector that achieves precise optics to replicate the beam pattern across mass produced lighting devices, but without using a complex and expensive base coat process. The part 100 also helps to incorporate use of LEDs in reflector technology as they are highly sensitive to surface profile. Further, the part 100 does not have hazing or clouding that is common in prior art reflectors that excluded a base coating.

Figure 2:
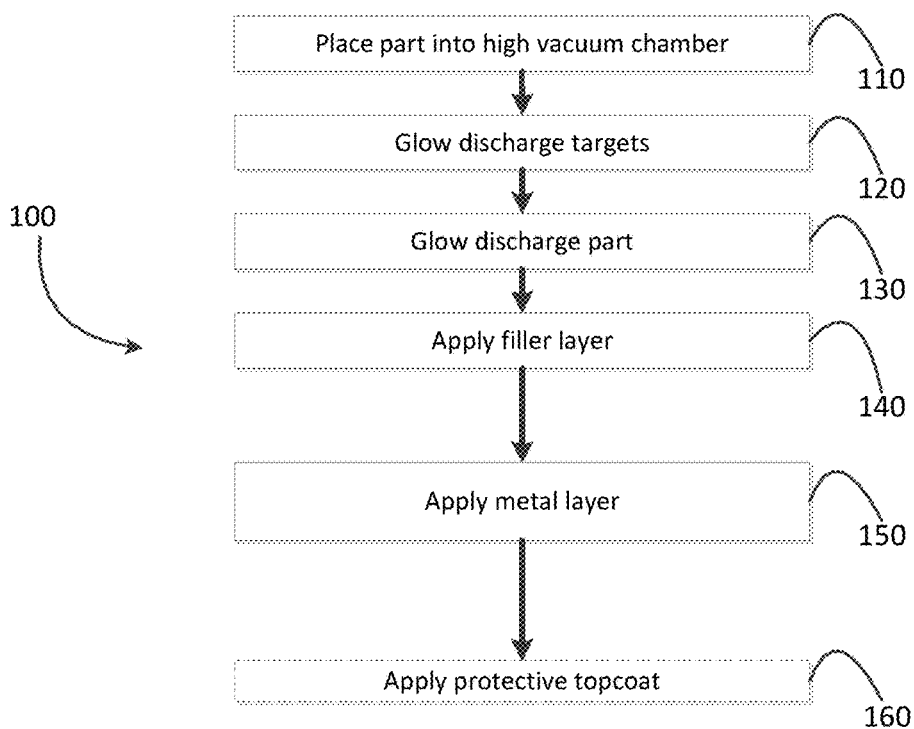
FIG. 2 illustrates a first exemplary algorithm for a process of coating a part according to one embodiment.

FIG. 2 illustrates a first exemplary algorithm 200 for a process of coating a BMC part with a reflective material. The steps of the algorithm 200 may be performed using a magnetron sputtering apparatus, such as a magnetron sputtering apparatus using the vacuum chamber 300 illustrated in FIG. 3 and discussed below. In step 110, a BMC part is placed into the high vacuum chamber of the magnetron sputtering apparatus for application of a sputtered coating onto the substrate. In one embodiment, the substrate can be an automotive part and in particular, the substrate can be a reflective component of an automotive lamp, such as a parabolic reflector.

Figure 3:
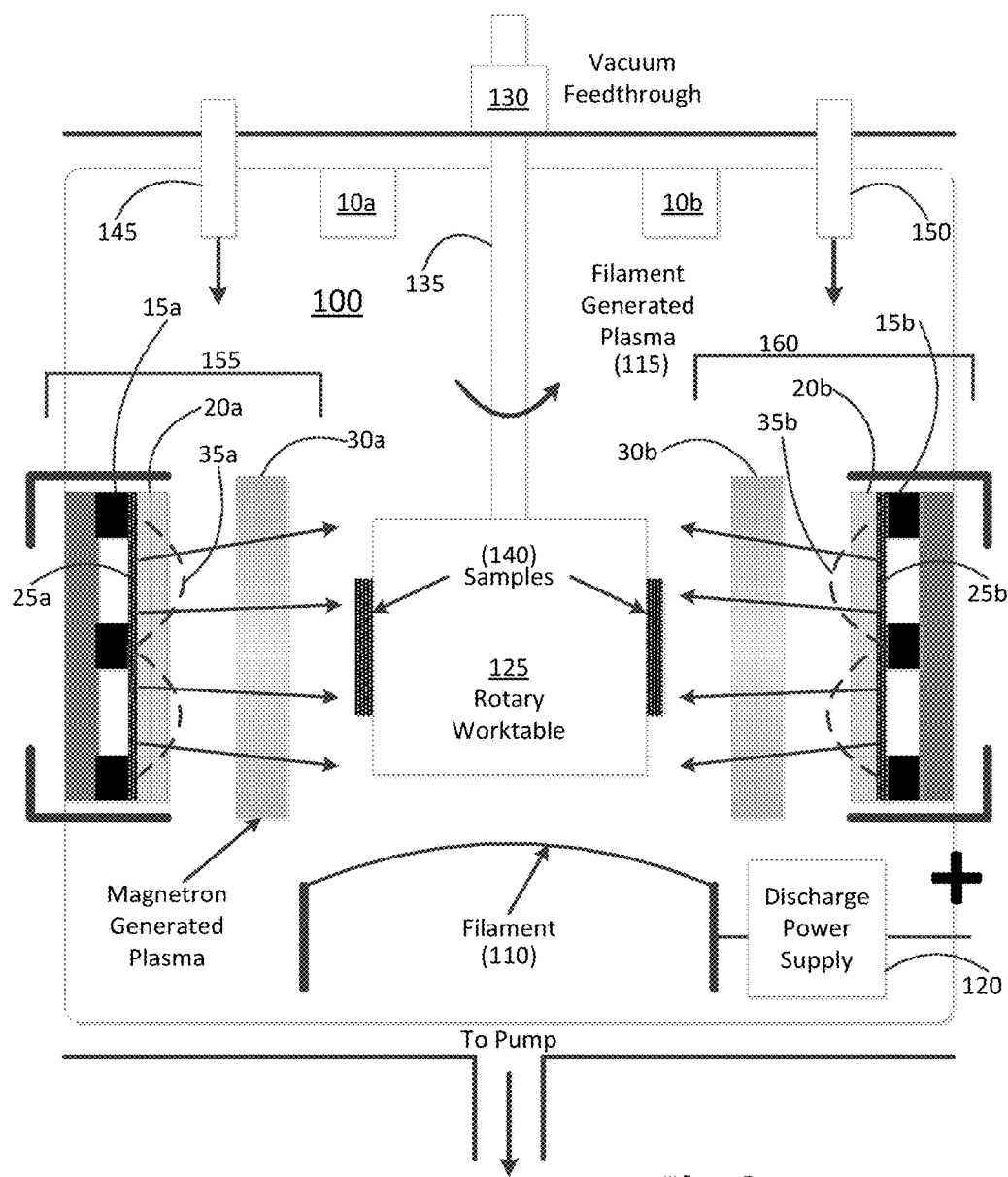
FIG. 3 is a cross-sectional view of an exemplary sputtering apparatus according to one embodiment.

In step 220, targets within the vacuum sputter chamber are exposed to a glow discharge to remove oxides and/or other contaminants from the targets. As illustrated in FIG. 3, the sputtering chamber may include a plurality of target sources. In step 230, the substrate is exposed to a glow discharge to remove any gases from the substrate.

In step 240, a filler layer is applied to a surface of the BMC part. In one embodiment, the filler layer includes a Silicon based layer such as a layer of a $SiO_2$ and/or non-stoichiometric $SiO_x$, wherein x is a number other than 2 which designates an amount of oxygen in the filler layer material. However, the filler layer can include other components suitable for smoothing the BMC surface roughness. TMDMSO (tetramethyldisiloxane) and air/oxygen are flowed into the chamber to obtain $SiO_2/SiO_x$. In one embodiment, the filler layer is approximately 20-100 nm thick. Alternatively, the filler layer may be a sputtered copper layer. Still further, the filler layer may be both a Silicon based layer and a copper layer.

In step 250, a reflective metal layer is applied on the filler layer. The reflective metal layer is formed by sputtering a target to form a sputtered coating onto the substrate in the vacuum chamber. Process parameters such as sputtering power levels and sputtering process time can control the amounts of target material deposited on the filler layer.

In step 260, a protective topcoat is applied to the sputtered metal layer. In one embodiment, the protective topcoat is Plasil™. Plasil™ is a siloxane material, such as hexymethyldisiloxane (HMDSO). Tetramethyldisiloxane (TMDSO) is another siloxane material that can be used with embodiments described herein. HMDSO and tetramethyldisiloxane are described in the published patent CA 2294658C, which is incorporated in its entirety by reference herein. However, other materials that provide a clear protective coating to the reactive sputtered coating and provide protection from a harsh automotive lamp environment can be used for a protective topcoat.

FIG. 3 is a cross-sectional view of a vacuum chamber 100 of a magnetron sputtering apparatus according to one embodiment. A filament 110 provides a filament generated plasma 115 within the vacuum chamber 100, via a discharge power supply 120.

A rotary worktable 125 is driven by a driving motor 130 by means of a rotating shaft 135. A plurality of samples 140, such as substrates is affixed to sides of the rotary worktable 125. However, a single sample 140 could be present on the rotary worktable 125. FIG. 3 also illustrates a process gas port 145 and a reactive gas port 150.

Vacuum chamber 100 also illustrates a first sputtering target apparatus 155 and a second sputtering target apparatus 160. Each sputtering target apparatus 155 and 160 works in conjunction with a respective first independent sputtering target power supply 10a and a second independent sputtering target power supply 10b. The first and second independent sputtering target power supplies 10a and 10b are configured to operate independently. As a result, the first and second independent sputtering target power supplies 10a and 10b can operate at different power levels and at different sputtering frequencies. In addition, the first and second independent sputtering target power supplies 10a and 10b can sputter simultaneously or alternately.

Each sputtering target apparatus 155 and 160 includes a respective first magnetron 15a and a second magnetron 15b, each of which includes a plurality of magnets. A first target 20a and a second target 20b are attached to their respective magnetrons 15a and 15b, via a respective first backing plate 25a and a second backing plate 25b. Targets 20a and 20b can be the same target material or a different target material. For example, these targets may both be formed of aluminum for deposition of the aluminum reflecting layer. Alternatively, one of the targets may be formed of aluminum, and the other target formed of copper for depositing a copper filler layer at a rapid deposition rate. Still further, only a single sputtering target may be provided in the apparatus.

A first magnetron generated plasma 30a and a second magnetron generated plasma 30b are formed between the respective targets 20a and 20b and the samples 140 during operation of the magnetron sputtering apparatus. First magnetic fields 35a and second magnetic fields 35b are also generated during operation of the magnetron sputtering apparatus. Target material is sputtered from the respective targets 20a and 20b towards the samples 140 during operation of the magnetron sputtering apparatus. Rotation of the samples 140, via the rotary worktable 125 provides a uniform coating onto the samples 140.

Figure 4:
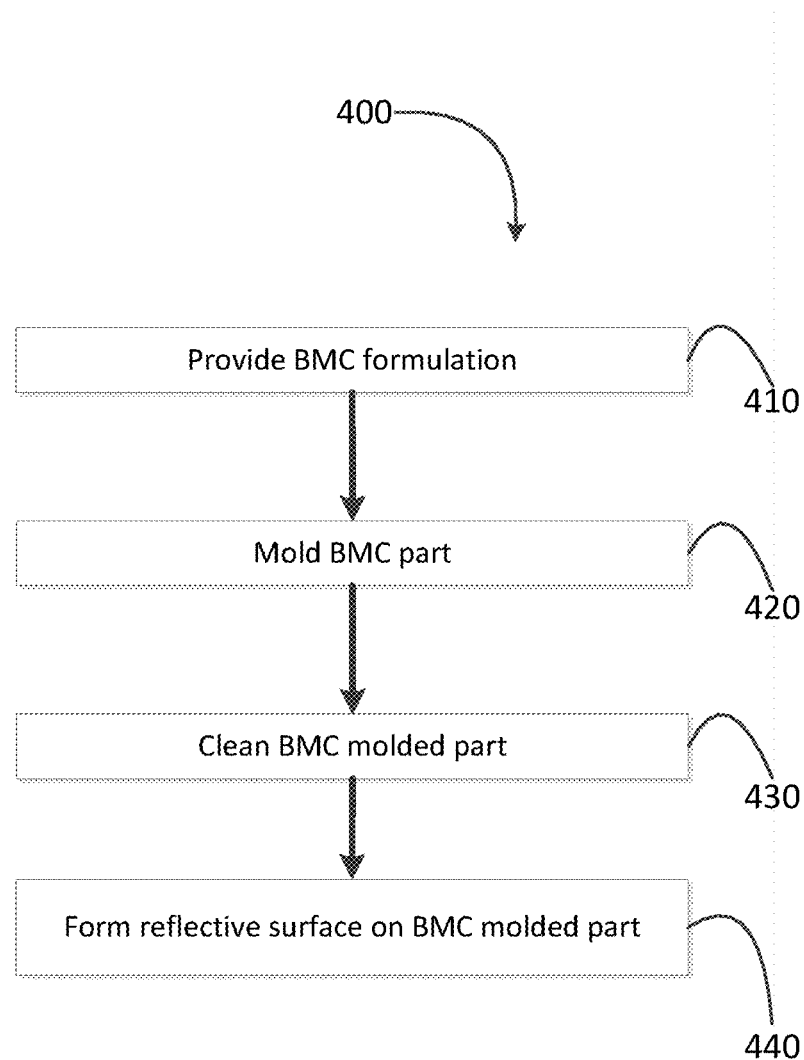
FIG. 4 illustrates an exemplary algorithm for a process of forming a vehicle light reflector according to one embodiment.

FIG. 4 illustrates an exemplary algorithm for a process of forming a vehicle light reflector according to one embodiment. In step 410, a BMC formulation is provided. A typical thermoset molding compound used in headlamp manufacture contains an unsaturated polyester resin, Styrene, a low profile additive, mineral fillers, and glass reinforcements. Such bulk molding materials are known in the art, and numerous variations to the particular composition are possible. However, the present inventors discovered that a BMC formulation with super fine crushed glass dispersed therein can improve surface roughness of the molded part. For example, conventional molded BMC parts have a typical surface roughness of 250 microns. Dispersing crushed glass with a particle size of 300-600 nm or 30 to 50 mesh size in the BMC compound provides a surface roughness of 120 to 150 microns.

In step 420, a part is molded using the BMC formulation. The molding technique may be a rapid injection, wherein the bulk material is quickly fed into the mold under heat and pressure. Alternatively, rapid injection and compression is performed, wherein the bulk material is rapidly fed into a slightly open mold under heat and pressure. The mold is left slightly open during the filling step, providing a gap opening. After the mold is filled, additional pressure is applied to the material by closing the mold gap. The fully closed mold is then held under pressure while the material cures. The molding parameters that have proven to produce the best part for complex or parabolic headlamp reflectors are barrel temperature, back pressure, barrel residence time, compression gap, injection speed, injection flow rate, injection pressure, cushion, hold pressure, hold pressure time, mold surface temperature, and cure time, for example.

The BMC molded part is then cleaned in step 430. Cleaning may include initial cleaning with deionized water and/or various solvents outside of a process chamber. The cured parts are then cleaned to remove dust or particles. The dust removal cleaning can be done with water or solvents; however, the chosen fluid and application method should not leave any contamination (such as spotting) on the reflector region surface. Any residue or contamination in the reflector region becomes visible after metallization resulting in performance failures due to uncontrolled scattering of light. Deionized water and IPA isopropyl alcohol solvent washes have both proven to be successful with ambient temperature followed by 350 F. Forced convection air may be used as part of a post drying processes to drive off residual water or solvents.

In step 440, a reflective layer is provided on the BMC part as described in FIG. 2. This step generally includes plasma cleaning within the vacuum chamber in addition to the solvent cleaning discussed above.

Next, in step 440, the molded parts are assembled onto fixtures and placed in the vacuum metallization chamber for the coating process of FIG. 2 described above. The typical vacuum metallization cycle is: 38 to 42 minutes pump down (magnetron sputtering with bigger pumps pump down in 2-3 mins) at 0.002 millibar, 3 to 5 minutes glow discharge(1-2 mins glow discharge) at 0.01 Mbar, 1 minute aluminum deposition at 0.0004 Mbar. A protective layer is then added in step 450. A preferred method is to follow the metallization with 12 to 15 minutes of siloxane (we deposit siloxane for 1-3 mins) deposition at 0.002 Mbar, and 1 minute of ventilation. The siloxane forms a protective overcoating on the reflective aluminum layer. Upon removal from the chamber the parts are bonded and assembled with their appropriate lenses, lamp and associated hardware as the case may be.

Thus, disclosed embodiments may include a new BMC formulation and processing technique to create a surface with low roughness to get a good metallized surface. The BMC is made in inert atmosphere (to avoid less moisture) to obtain a haze free surface and surface roughness of approximately 120-150 nm. An in-chamber filler process is provided to create high reflective surface on the BMC for different types of light sources and reflector designs. The intermediate filler layer is followed by metallization, and HMDSO to protect the aluminum.

This in-chamber process provides for cost reduction on machinery, and reduced cycle times relative to conventional base coating processes. Further, the in-chamber process provides a high quality reflective surface without the clouding or hazing that is observed with conventional direct metallization processes that avoid use of acrylic spray base coating.

While certain embodiments have been described herein, these embodiments are presented by way of example only, and are not intended to limit the scope of the disclosure. Using the teachings in this disclosure, a person having ordinary skill in the art can modify and adapt the disclosure in various ways, making omissions, substitutions, and/or changes in the form of the embodiments described herein, without departing from the spirit of the disclosure. Moreover, in interpreting the disclosure, all terms should be interpreted in the broadest possible manner consistent with the context. The accompanying claims and their equivalents are intended to cover such forms or modifications, as would fall within the scope and spirit of the disclosure.

The invention claimed is:

1. A method of treating a part, comprising:
    placing a bulk molded compound (BMC) part into a vacuum chamber of a magnetron sputtering apparatus;
    igniting a plasma in the vacuum chamber;
    depositing a filler layer to the surface of the BMC part; and
    sputter depositing a metal layer onto the filler layer to create a reflective surface of the BMC part.

2. The method of claim 1, wherein the BMC part comprises crushed/super fine glass dispersed in a BMC compound.

3. The method of claim 2, wherein the crushed glass has a particle size of 300-600 nm.

4. The method of claim 1, wherein the BMC part has a surface roughness of 200 microns or less.

5. The method of claim 4, wherein the BMC part has a surface roughness of 120 to 150 microns.

6. The method of claim 1, wherein said depositing a filler layer comprises depositing a layer comprising at least one of copper, SiO2, and SiOx, where x is a number other than 2 which represents the amount of oxygen.

7. The method of claim 6, wherein said depositing a filler layer comprises:
    depositing a second layer of sputtered copper on the first layer or vice versa.

8. The method of claim 1, further comprising cleaning the BMC part prior to forming the filler layer.

9. The method of claim 8, wherein said cleaning comprises exposing a surface of the BMC part to a glow discharge process.

10. The method of claim 1, wherein the metal layer consists of aluminum.

11. The method of claim 1, further comprising applying a protective layer onto the part after depositing a coating onto the part.

12. The method of claim 11, wherein the protective layer includes one of hexymethyldisiloxane (HMDSO) or tetramethyldisiloxane (TMDSO).

13. A vehicle lighting device comprising:
    a base molding compound (BMC) part;
    a vacuum chamber deposited filler layer provided directly on the BMC part; and
    a metal layer provided directly on the filler layer, wherein the BMC part comprises crushed glass dispersed in a BMC compound and the crushed glass has a particle size of 300-600 nm.

14. The device of claim 13, wherein said filler layer comprises at least one of copper, SiO2, and SiOx, where x is a number other than 2 which represents the amount of oxygen.

15. The device of claim 13, wherein the metal layer comprises aluminum.

16. The device of claim 15, wherein the metal layer consists of aluminum.

17. The device of claim 16, further comprising a protective layer formed directly on the metal layer.

18. The device of claim 11, wherein the protective layer comprises one of hexymethyldisiloxane (HMDSO) or tetramethyldisiloxane (TMDSO).

* * * * *